(12) United States Patent
Neo et al.

(10) Patent No.: US 10,501,313 B2
(45) Date of Patent: *Dec. 10, 2019

(54) FLUID EJECTION DEVICE

(71) Applicants: STMicroelectronics Asia Pacific Pte Ltd, Singapore (SG); STMicroelectronics S.r.l., Agrate Brianza (IT); STMicroelectronics, Inc., Coppell, TX (US)

(72) Inventors: Teck Khim Neo, Singapore (SG); Mauro Pasetti, Milan (IT); Franco Consiglieri, Piacenza (IT); Luca Molinari, Piacenza (IT); Andrea Nicola Colecchia, Agrate Brianza (IT); Simon Dodd, West Linn, OR (US)

(73) Assignees: STMicroelectronics Asia Pacific Pte Ltd, Singapore (SG); STMicroelectronics S.r.l., Agrate Brianza (IT); STMicroelectronics, Inc., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/915,454

(22) Filed: Mar. 8, 2018

(65) Prior Publication Data

US 2018/0194614 A1 Jul. 12, 2018

Related U.S. Application Data

(63) Continuation of application No. 15/240,709, filed on Aug. 18, 2016, now Pat. No. 9,938,136.

(51) Int. Cl.
*B81B 7/00* (2006.01)
*B05B 1/24* (2006.01)
(Continued)

(52) U.S. Cl.
CPC ............ *B81B 7/008* (2013.01); *B05B 1/24* (2013.01); *B05B 17/06* (2013.01);
(Continued)

(58) Field of Classification Search
CPC ............ B41J 2/04501; B41J 2/04541; B41J 2/04543; B41J 2/14016; B41J 2/14072;
(Continued)

(56) References Cited

U.S. PATENT DOCUMENTS 5,644,342 A 7/1997 Argyres
6,257,706 B1 7/2001 Ahn
(Continued)

FOREIGN PATENT DOCUMENTS

CN 1220944 A 6/1999
CN 1277110 A 12/2000
(Continued)

*Primary Examiner* — Anh T Vo
(74) *Attorney, Agent, or Firm* — Seed IP Law Group LLP (57) ABSTRACT

The present disclosure is directed to a microfluidic die that includes ejection circuitry and one time programmable memory with a minimal number of contact pads to external devices. The die includes a relatively large number of nozzles and a relatively small number of contact pads. The die includes decoding circuitry that utilizes the small number of contact pads to control the drive and ejection of the nozzles and the reading/writing of the memory with the same contact pads.

13 Claims, 9 Drawing Sheets

(51) Int. Cl.
*B41J 2/045* (2006.01)
*B41J 2/14* (2006.01)
*B05B 17/06* (2006.01)

(52) U.S. Cl.
CPC ....... *B41J 2/04501* (2013.01); *B41J 2/04541* (2013.01); *B41J 2/04543* (2013.01); *B41J 2/14016* (2013.01); *B41J 2/14072* (2013.01); *B81B 2201/05* (2013.01); *B81B 2207/012* (2013.01); *B81B 2207/091* (2013.01)

(58) Field of Classification Search
CPC ................ B81B 7/008; B81B 2201/05; B81B 2207/012; B81B 2207/091; B05B 1/24; B05B 17/06
See application file for complete search history.

(56) References Cited

U.S. PATENT DOCUMENTS

| | | | |
|---|---|---|---|
| 2002/0005878 A1 | 1/2002 | Moon et al. | |
| 2005/0259123 A1 | 11/2005 | Rice et al. | |
| 2014/0048799 A1* | 2/2014 | Tour | H01L 27/2463 257/43 |
| 2016/0140357 A1* | 5/2016 | Newell | G06F 3/0679 726/2 |
| 2017/0021614 A1* | 1/2017 | Maxfield | B41J 2/14153 |
| 2017/0021617 A1* | 1/2017 | Ghozeil | B41J 2/04541 |

FOREIGN PATENT DOCUMENTS

| | | |
|---|---|---|
| CN | 102754028 A | 10/2012 |
| CN | 105195244 A | 12/2015 |
| EP | 0 641 659 A2 | 8/1994 |

* cited by examiner

FLUID EJECTION DEVICE

BACKGROUND

Technical Field

The present disclosure is directed to a fluid ejection device that includes a die having nozzles, heaters, driving circuitry, and memory.

Description of the Related Art

Microfluidic die are fluid ejection devices that include chambers, nozzles, and passive electronic components that expel fluid from the chambers. These die typically do not include drive circuitry on the same semiconductor substrate as the chambers and nozzles. The drive circuitry is often provided on a separate die, on a different substrate, that is coupled to the microfluidic die. The separate die may be an application specific integrated circuit (ASIC) that is incorporated within a same final product or package and electrically coupled to the microfluidic die to provide control and drive signals to the microfluidic die to control ejection of the fluid.

As each of these die have very different components, the microfluidic die being passive and the ASIC having active semiconductor components, like transistors, these two different die are formed with very different semiconductor processing steps. One of the reasons to form two separate die is associated with size and a number of contact pads that are associated with a number of nozzles on the microfluidic die. It is common to have one drive signal for one nozzle and thus, a contact pad for each nozzle. As microfluidic die are including more and more nozzles, the number of contact pads is increasing and taking up valuable space on the microfluidic die. Incorporating driving circuitry with the associated contact pads into a microfluidic die having a large number of nozzles has become a challenge.

BRIEF SUMMARY

The present disclosure is directed to a microfluidic die that includes a large number of nozzles, such as 80 or 120 nozzles, with driving circuitry and a relatively small number of contact pads, such as 16. The microfluidic die can include memory in a same substrate as the drive circuitry while maintaining the small number of contact pads.

DETAILED DESCRIPTION

In the following description, certain specific details are set forth in order to provide a thorough understanding of various embodiments of the disclosure. However, one skilled in the art will understand that the disclosure may be practiced without these specific details. In some instances, well-known details associated with semiconductors, integrated circuits, and microfluidic delivery systems have not been described to avoid obscuring the descriptions of the embodiments of the present disclosure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

The present disclosure is directed to a microfluidic die that has a relatively small number of contact pads coupled to an external device in order to drive a relatively large number of nozzles. For example, a ratio of a total number of contact pads on the die to a total number of nozzles may be in the range of 18:120 (3:20) and 16:80 (2:10). This small ratio of the total number of contact pads to the total number of nozzles also provides for read/write control of memory included on the microfluidic die. Different ratios of the number of contact pads to the number of nozzles and a number of memory bits can be varied. For example, there may be 30 contact pads for 120 nozzles and 120 memory bits. In addition, a ratio of the number of the plurality of driving circuits to the number of the plurality of contact pads is in the range of 40:16 (5:2) and 40:15 (8:3).

A ratio of the number of nozzles to the number of contact pads and memory bits will depend on how the nozzles and associated chambers will be driven. For example, if the nozzles are driven in pairs, then the number of associated memory bits can be halved and the number of contact pads can be reduced. Various combinations are discussed below.

The die also includes decoding circuitry that utilizes the same contact pads to drive the fluid ejection through the nozzles and to read or write the memory. The contact pads include a first group of contact pads that are associated with the selection of a specific nozzle or nozzle group and that corresponds to the related memory bit or bits. There is a second group of contact pads that are associated with selection of ejecting fluid, reading the memory, or writing the memory. The number of the first group of contact pads is larger than the number of the second group of contact pads. For example, the first group may have six contact pads and the second group may have three contact pads.

Figure 1:
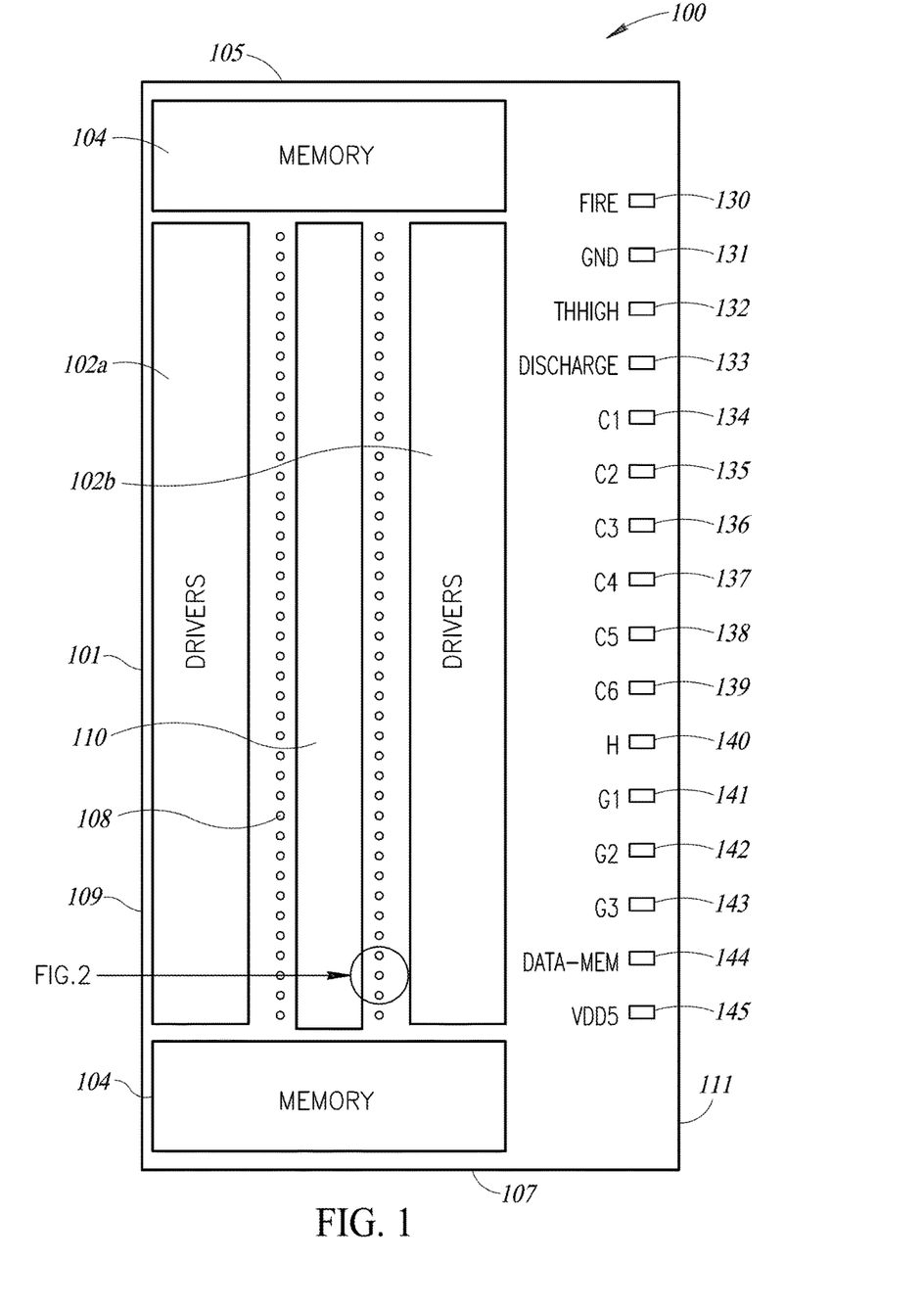
FIG. 1 is a schematic of a die including a plurality of nozzles and a plurality of driving circuits according to an embodiment of the present disclosure.

FIG. 1 is a schematic view of a microfluidic die 100 having driving circuitry 102a, 102b and memory 104. The die includes a plurality of contact pads 130-145 that provide input signals to the driving circuitry 102a, 102b and memory 104 during operation of the die. The die also includes a plurality of nozzles 108 and a fluid inlet path 110 that passes through a substrate to provide fluid from a reservoir (not shown) to chambers 112, see FIG. 2.

The memory 104 may be fuses or other memory devices that are configured to store at least one bit of data. The memory 104 is positioned along a first side 105 of the die and along a second side 107 of the die. The die is rectangular, where the first side and the second side are shorter in length than a third side 109 and a fourth side 111. The inlet path 110 is transverse in length to the first and second side and is transverse to an area of the die that includes the memory. In other embodiments, the memory may be positioned between the driving circuitry 102b and the contact pads 130-145, which are aligned along and closer to the fourth side 111.

Figure 2:
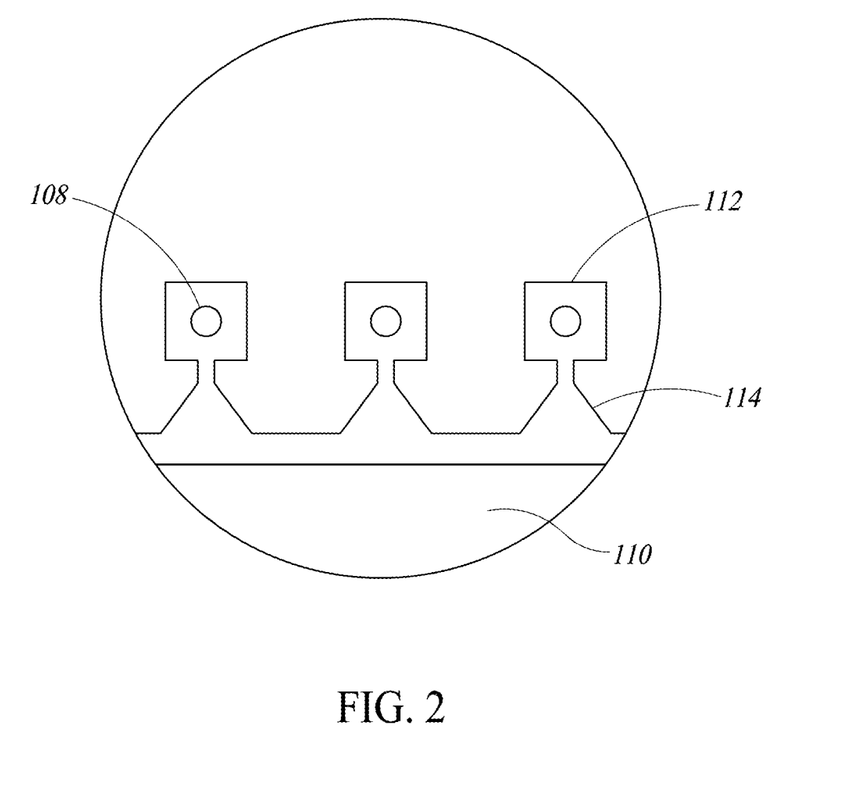
FIG. 2 is an enhanced view of several chambers from the die of FIG. 1.

The chambers are illustrated as having a one-to-one relationship with the nozzles 108; however, there may be more than one nozzle per chamber. Each chamber receives fluid from the inlet path 110 through channels 114. In this configuration, there are eighty nozzles.

The contact pads include a FIRE contact 130, a ground contact 131, a THHIGH contact 132, a DISCHARGE contact 133, six first selection contacts 134-139 (C1-C6), an H contact 140, three second selection contacts 141-143 (G1-G3), a data-memory output contact 144, and a power contact 145 (VDDS).

Figure 3:
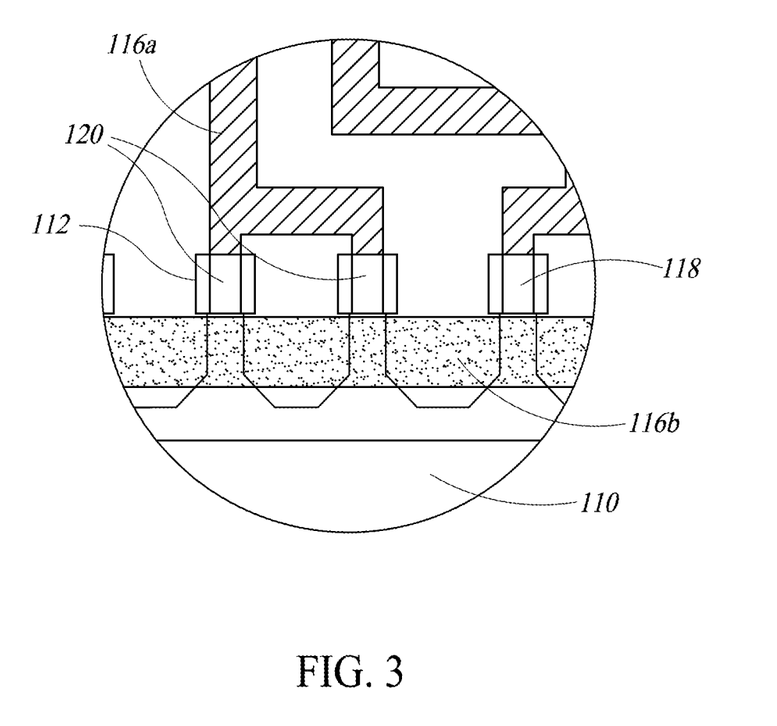
FIG. 3 includes electrical connections associated with heaters and the chambers of FIG. 2.

In FIG. 3, electrical connections 116a, 116b are coupled to sides of each heater 118 aligned with each chamber 112. In operation, the heaters generate heat that causes a bubble to form in the liquid in the chamber and when the bubble pops, liquid is ejected from the nozzle. It is envisioned the heaters could alternatively be piezo-resistive devices. Electrical connection 116b is the ground line in this embodiment, and the electrical connections 116a receive input driving signals from the driving circuitry. The signals and how they are generated will be described in more detail below. In this configuration, 120 pairs of heaters are driven by a single electrical connection 116a. When considering the configuration of FIG. 1, which has eighty nozzles, there will be 40 pairs of heaters.

The ground electrical connection 116b is illustrated as positioned between the chambers and the inlet path 110. This is one possible configuration. Other arrangements of the electrical connections are envisioned. The electrical connections are likely formed on the substrate prior to formation of the channels, chambers, and nozzles.

Figure 4:
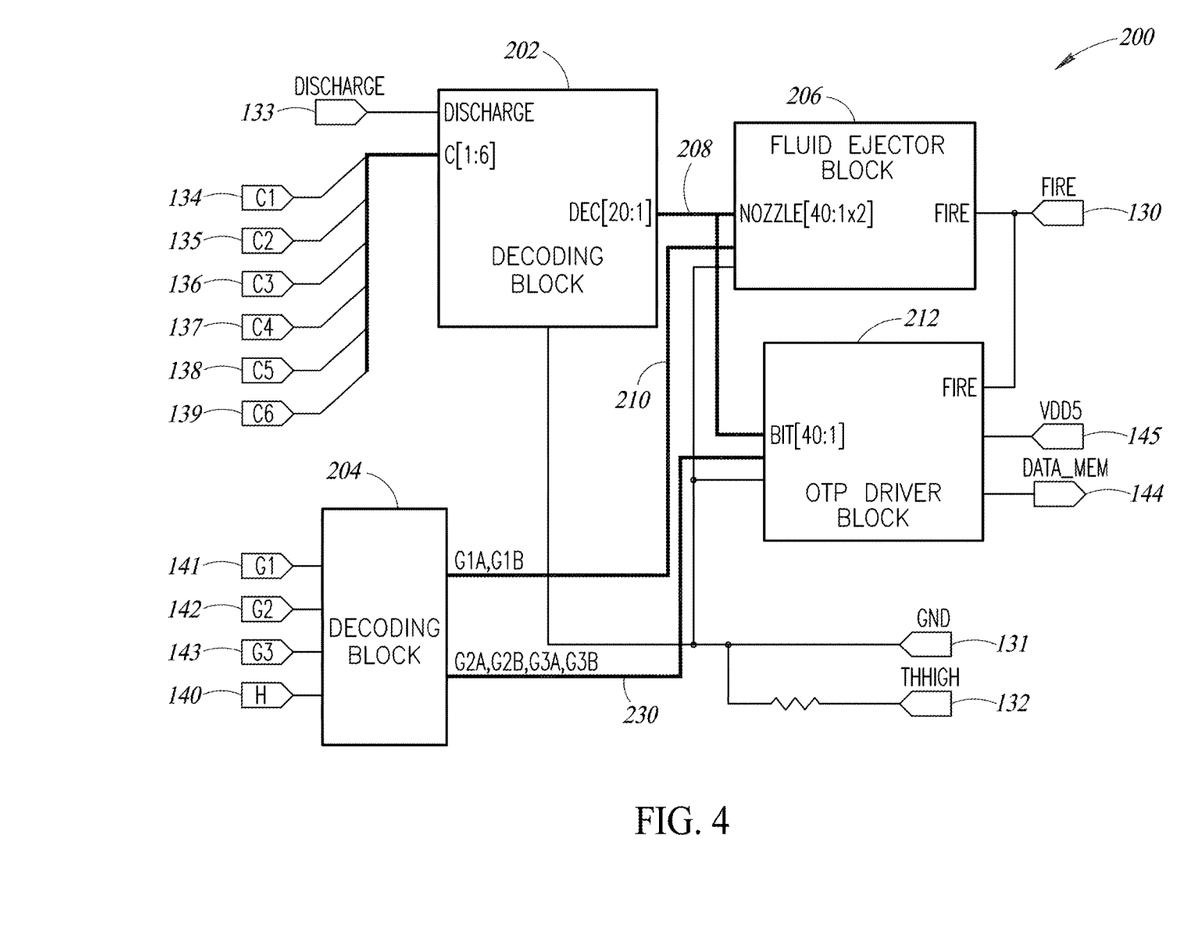
FIG. 4 is a block diagram of circuitry incorporated within the die of FIG. 1 according to an embodiment of the present disclosure.

FIG. 4 is a block diagram of circuitry 200 included in the microfluidic die 100. The circuitry 200 includes the driving circuitry 102a, 102b. The circuitry 200 is coupled to the contact pads 130-145. The circuitry includes active and passive circuitry. A first decoding block 202 is active circuitry that is coupled to the DISCHARGE contact 133, the first selection contacts 134-139, the ground contact 131, and the THHIGH contact 132. A second decoding block 204 is also active circuitry that is coupled to the second selection contacts 141-143 and the H contact 140.

A fluid ejection block 206 receives a first input 208 from the first decoding block 202 and a second input 210 from the second decoding block 204. The fluid ejection block is also coupled to the ground contact 131, the THHIGH contact 132, and the FIRE contact 130.

A memory driver block (one-time programmable (OTP)) 212 receives the first and second inputs 208, 230, and is coupled to the ground contact 131, the THHIGH contact 132, and the FIRE contact 130. The memory driver block uses the same first and second selection contacts as the fluid ejection block, reducing the number of contacts for the microfluidic die.

Together, each of these blocks 202, 204, 206, 212, work to receive control inputs from the contact pads and eject fluid from the appropriate nozzles. In one embodiment, the number of nozzles included on the die is 80. The nozzles are driven in pairs, so there are 40 pairs of nozzles. In this embodiment there are 40 memory bits, one bit for each pair of nozzles. There are six contact pads, the first selection contacts 134-139 that are used, with H contact 140, to drive the 40 pairs of nozzles. There are three second selection contacts 141-143 that are used to select between driving the pairs of nozzles and reading or writing the memory. With this circuitry, the number of contact pads can be minimized and will save space on the die. For example, a ratio of the number of contact pads to a number of nozzles may be in the range of 18:120 (0.15) and 16:80 (0.2). The ratio of the number of contact pads to a number of nozzles is preferably less than 0.2 and ideally less than 0.15. A ratio of a number of driving circuits to a number of first selection contacts is in the range of 20:3 and 10:1.

Figure 5:
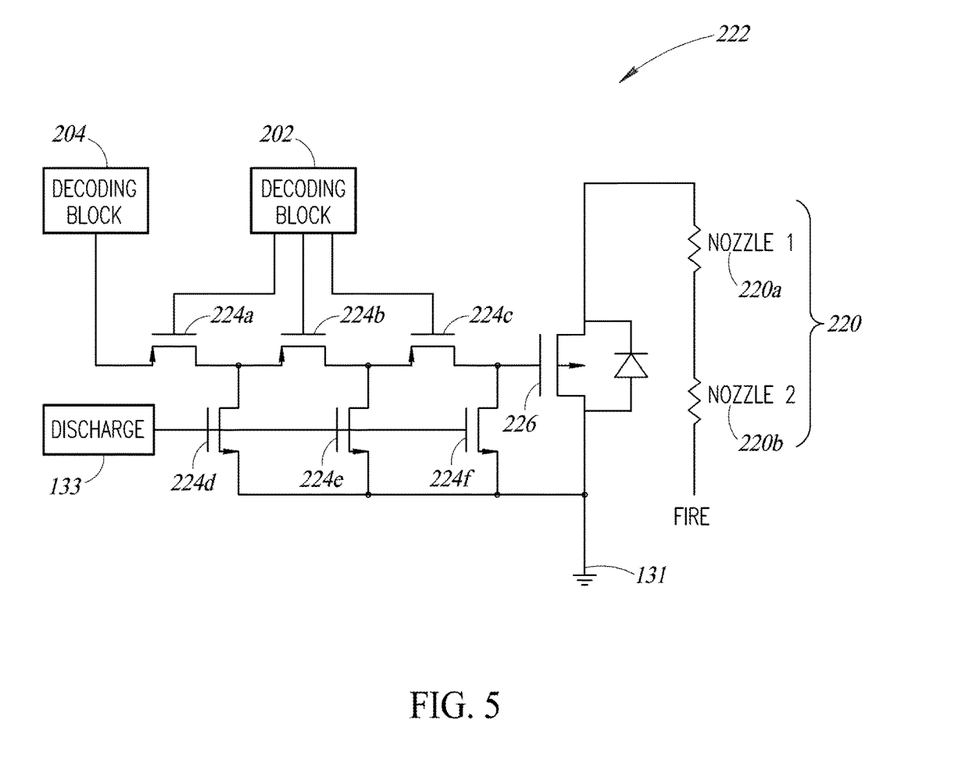
FIG. 5 is driving circuitry associated with a pair of nozzles and heaters of the die of FIG. 1 according to an embodiment of the present disclosure.
Figure 6:
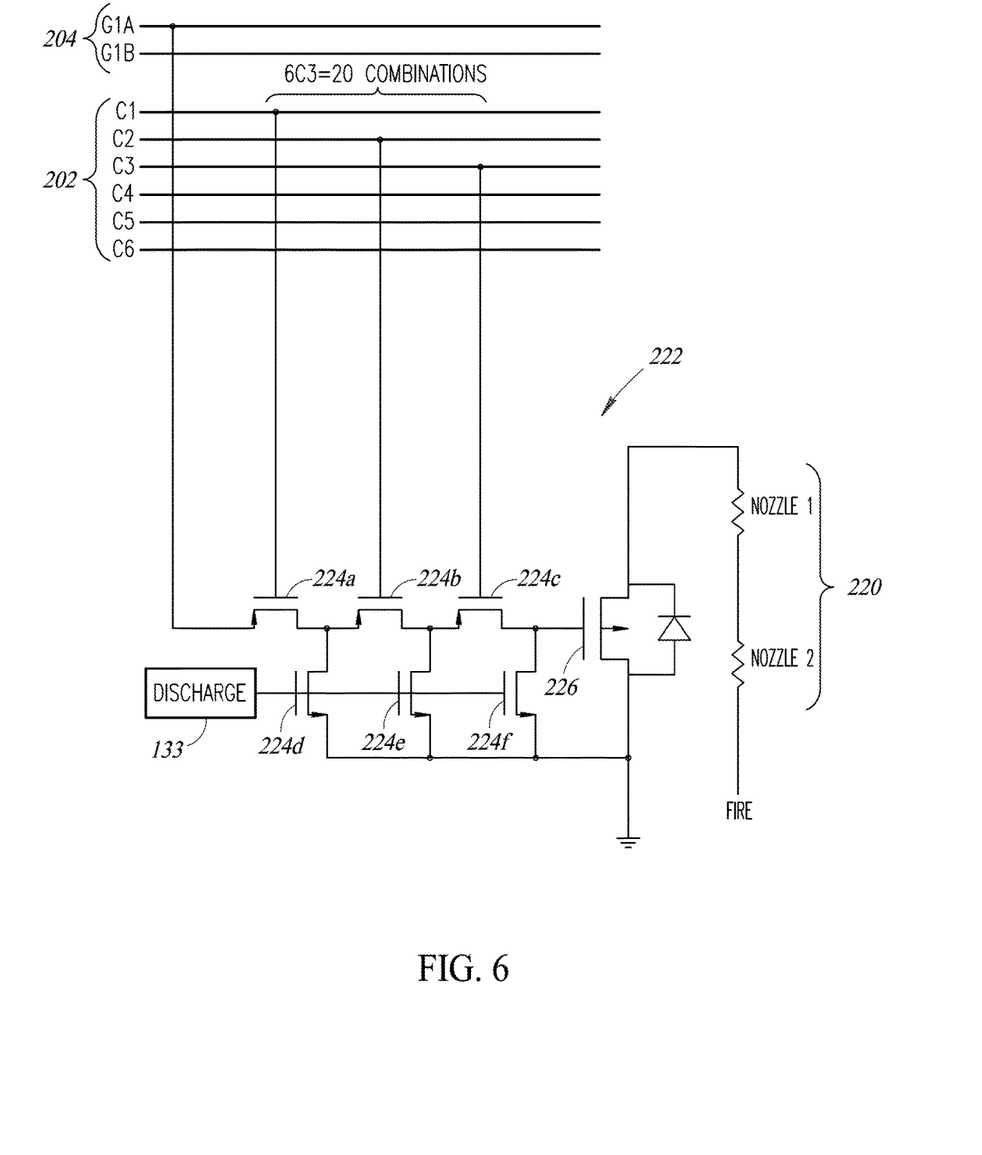
FIG. 6 is the driving circuitry of FIG. 5 with an example configuration associated with contact pads on the die of FIG. 1.

FIGS. 5 and 6 are an example of circuitry 222 in conjunction with selection signals that may be provided to ejected fluid from Nozzle 1 and Nozzle 2. In particular, FIG. 5 is an example of circuitry 222 formed on a semiconductor substrate of the die. The semiconductor substrate can be silicon or any suitable substrate to support active circuitry and microfluidic features. The circuitry 222 is associated with a pair 220 of chambers and nozzles 220a, 220b, which are represented as resistors. For each pair 220 of chambers and nozzles, there are six transistors 224a-224f and a firing transistor 226. These transistors are arranged to receive drive and selection signals from the first and second decoding blocks 202, 204. These transistors may be N-type LDMOS transistors (laterally diffused metal oxide semiconductor) or any other type of transistor suitable for formation on a microfluidic die.

A first transistor 224a is coupled between the second decoding block 204 and a second transistor 224b. A gate of the first transistor 224a is coupled to the first decoding block 202. The second transistor 224b is coupled between the first transistor 224a and a third transistor 224c. A gate of the second transistor 224b is coupled to the first decoding block 202. The third transistor 224c is coupled between the second transistor 224b and a gate of the firing transistor 226. A gate of the third transistor 224c is coupled to the first decoding block 202.

A fourth transistor 224d is coupled between ground 131 and a node between the first transistor 224a and the second transistor 224b. A fifth transistor 224e is coupled between ground 131 and a node between the second transistor 224b and the third transistor 224c. A sixth transistor 224f is coupled between ground 131 and a node between the third transistor 224c and the gate of the firing transistor 226. A gate of each of the fourth, fifth, and sixth transistors is coupled to the discharge contact pad 133. For each pair of chambers and nozzles, there is a group of at least these seven transistors.

In one variation, the first, second, and third transistors 224a, 224b, 224c are PMOS connected as pass-gate in series to the gate of the firing transistor 226, which may be LDMOS. These three gates of the first, second, and third transistors 224a, 224b, 224c are coupled to a 6-bit parallel interface, the first decoding block 202, that provides for 20 combinations of output signals based on the six inputs from the first selection contacts C1-C6. The decoding in the first decoding block will be active when G1A or G1B is active, i.e., the fluid ejection block 206 will only drive when both the first decoding block and the second decoding block provide active signals. See FIG. 4. The discharge contact 133 is provided to prevent malfunctions, which when selected or otherwise active provides a reset signal to floating nodes of the transistors.

In order to activate the firing transistor 226, each of the first, second, and third transistors 224a, 224b, and 224c must receive a signal at their respective gates. These signals come from the first decoding block 202 and correspond to signals from the first selection contacts C1-C6 (134-139). For example, as shown in FIG. 6, the first transistor 224a is configured to be activated based on a signal from the contact C1, which corresponds to contact pad 134. The second transistor is configured to be activated by a signal from the contact C2, which corresponds to contact pad 135. The third transistor 224c is configured to be activated based on a signal from the contact C3, which corresponds to the contact pad 136. This pair 220 of chambers and nozzles is driven when the contact pads C1, C2, and C3 receive drive signals. The second decoding block 204 also provides a signal; in this example, the signal comes from G1A, which corresponds to outputs of the second decoding block 204 and is in response to a combination of input signals to the contacts H (140) and G1-G3 (141-143). If the output signal G1B was output from the second decoding block 204, this pair 220 would not be activated, and a different pair, which also corresponds to the contacts C1, C2, and C3, would be activated. The discharge contact is configured to clear the signals, such as a reset.

One example of a configuration of a microfluidic die formed in accordance with the present disclosure will include 80 jets or nozzles, aligned in two rows, each spaced at 300 dots per inch. The die includes direct control logic that fires two jets at the same time, parallel in time; i.e., the chambers are driven in pairs, so that there are 40 total pairs of chambers. The firing frequency may reach 250 KHz. The firing is achieved by heating a heater positioned below each chamber, where there is a firing transistor associated with each pair of chambers. The firing transistor drives and is coupled to at least two heaters simultaneously. There may be more than one heater or piezo-resistive element per chamber. For example, some arrangements may have two heaters per chamber such that one firing transistor drives two heaters in a single chamber or one firing transistor drives four heaters, two heaters in each chamber. The heaters and piezo-resistive elements may be referred to as fluid ejection elements.

The memory may be configured to store 28 bits of data regarding cartridge information. The die includes reading and writing circuitry for the memory. There will be electrostatic discharge protection for all input/output pads and logic supply pads. This may use a firing voltage up to 20V. Such a die may have dimensions of 4.6 mm by 1.94 mm. This is simply an example and other dimensions and configurations are envisioned.

Three of the six first selection pins C1-C6, i.e., command pins, and one bench selection pin H, may be used to activate a single firing transistor. For example, with the six first selection contacts, there are 20 addressable combinations, and with the selection pin H, 40 addressable combinations are achieved. The three function pins, the second selection pins G1-G3, select an operation mode of the chip, eject fluid (G1), write memory (G2), and read memory (G3). The logic combination with H gives an internal signal to select the "bench," such that GnA will be active at 5V when H=0 and GnB will be active when H=1.

Table 1 is an example of signal definitions for this variation of a die formed in accordance with the present disclosure.

TABLE 1

| Pin | Name | Function | Type |
|---|---|---|---|
| 1 | FIRE | High voltage supply for heaters and OTP | Power supply |
| 2 | GNDPOW | Power ground | Power supply |
| 3 | THhig | High sensing resistor for thermal control | |
| 4 | DISCHARGE | Gate Ldmos common discharge | Input |
| 5 | C1 | Input Command 1 signal | Input |
| 6 | C2 | Input Command 2 signal | Input |
| 7 | C3 | Input Command 3 signal | Input |
| 8 | C4 | Input Command 4 signal | Input |
| 9 | C5 | Input Command 5 signal | Input |
| 10 | C6 | Input Command 6 signal | Input |
| 11 | H1 | Input Bench selector | Input |
| 12 | G1 | Input Group 1 signal | Input |
| 13 | G2 | Input Group 2 signal | Input |
| 14 | G3 | Input Group 3 signal | Input |
| 15 | DATA_MEM | Cell memory status information | Output |
| 16 | VDD5 | 5 V polarization | Input |

Figure 7:
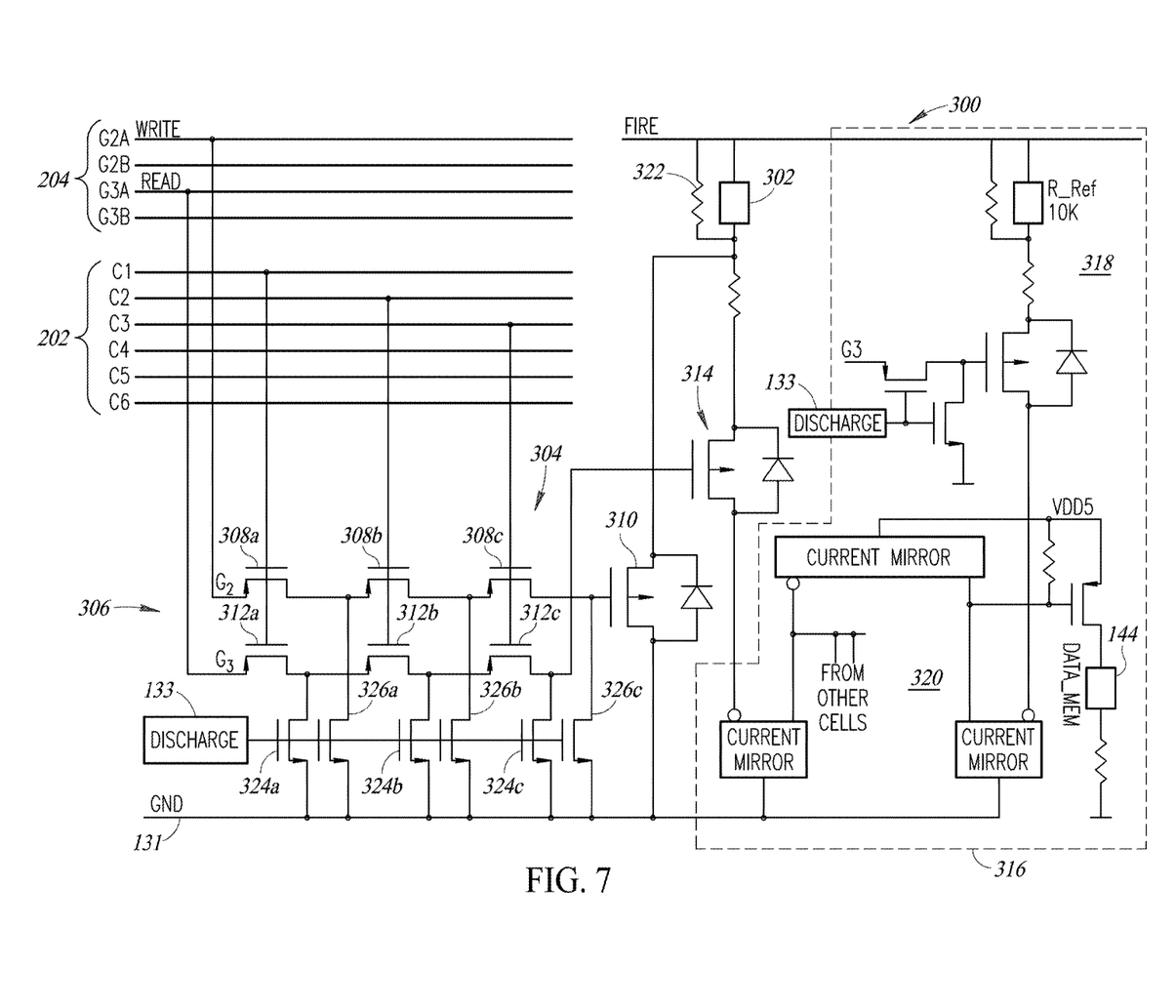
FIG. 7 is circuitry associated with programming memory included on the die of FIG. 1.

FIG. 7 is a representation of circuitry 300 included in the substrate of the microfluidic die for memory control. The second selection contacts, as output from the second selection block 204, are in the upper left hand corner, G2A, G2B, G3A, and G3B. These correspond to output signal 230 from the second selection block 204 in FIG. 4. The first selection contacts C1-C6, as output from the first decoding block 202 on output 208, are in the upper left hand corner as well.

In the illustrated embodiment, for each pair 220 of nozzles there is a memory bit. This memory control circuitry 300 uses the same signal selectors, the first and second decoding blocks, and the same contact pads as the chamber and nozzle control circuitry 222. There is a writing circuit 304 and a reading circuit 306 for each memory cell 302. The memory cell may be tantalum silicon nitride or other suitable memory cell for storing one bit of data, a one or a zero. This is one time programmable memory.

The writing circuit 304 includes three transistors 308a, 308b, 308c. These three transistors are coupled as pass-gate in series with a gate of a writing transistor 310. In particular, the first transistor 308a is coupled between a write signal line G2A, which is output from the second decoding block 204, and the second transistor 308b. A gate of the first transistor is active only when C1 (contact pad 134) is active. The second transistor is coupled between the first transistor 308a and the third transistor 308c. A gate of the second transistor is active only when C2 (contact pad 135) is active. The third transistor 308c is coupled between the second transistor 308b and the writing transistor 310. A gate of the third transistor is active only when C3 (contact pad 136) is active. The illustrated write circuit is only active when C1, C2, and C3 are active and the write control signal G2A is active. As can be appreciated, different combinations of the input contact pads will activate different ones of the write circuits 304.

The reading circuit 306 includes three transistors 312a, 312b, 312c and a reading transistor 314. These are arranged in the same pass-gate manner described above with respect to the writing circuit 304, where the three transistors are in series and coupled to a gate of the reading transistor 314. The difference is that the first transistor 312a is coupled to the read signal line G3A from the second decoding block. The same set of input contacts is used for reading and writing the memory cell 302. When read, the information from the memory cell is output to the contact pad 144, DATA-MEM.

The die includes extra read circuitry 316 that is common to or shared by all of the reading circuits 306. The common read circuitry 316 is coupled to each memory cell and includes a reference circuit 318 and a current comparator 320. An anti-leakage resistor 322 may be included in parallel with the memory cell.

Each of the reading circuit 306 and the writing circuit 304 also include three discharge transistors. The writing discharge transistors 326a, 326b, 326c are coupled between ground and a respective one of the reading transistors 308a, 308b, 308c. The reading discharge transistors 324a, 324b, 324c are coupled between ground and a respective one of the reading transistors 312a, 312b, 312c. Each gate of each of the reading discharge and writing discharge transistors is coupled to the discharge contact pad 133.

Figure 8:
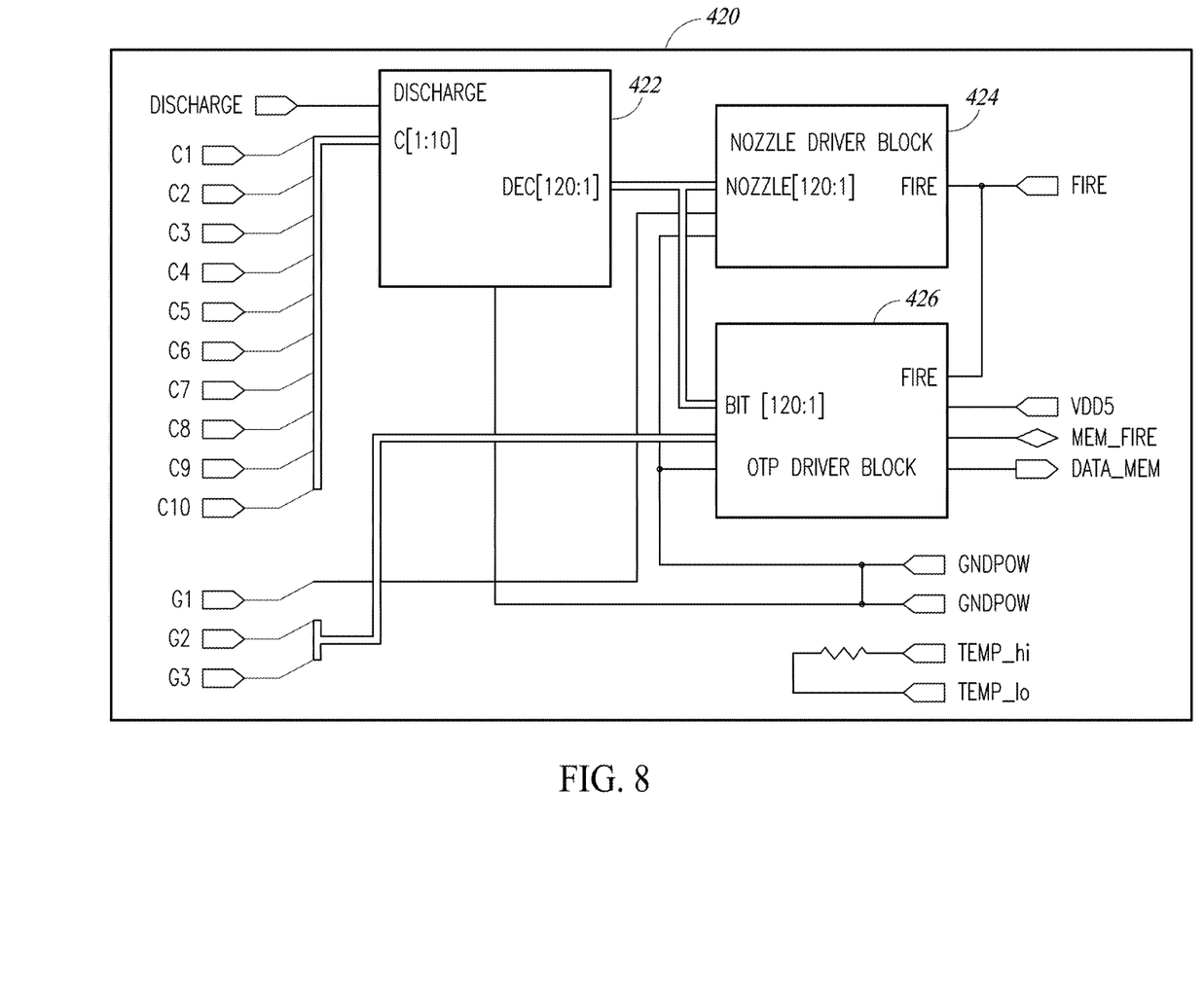
FIGS. 8 and 9 are alternative embodiments of driving circuitry and a microfluidic die according to the present disclosure.
Figure 9:
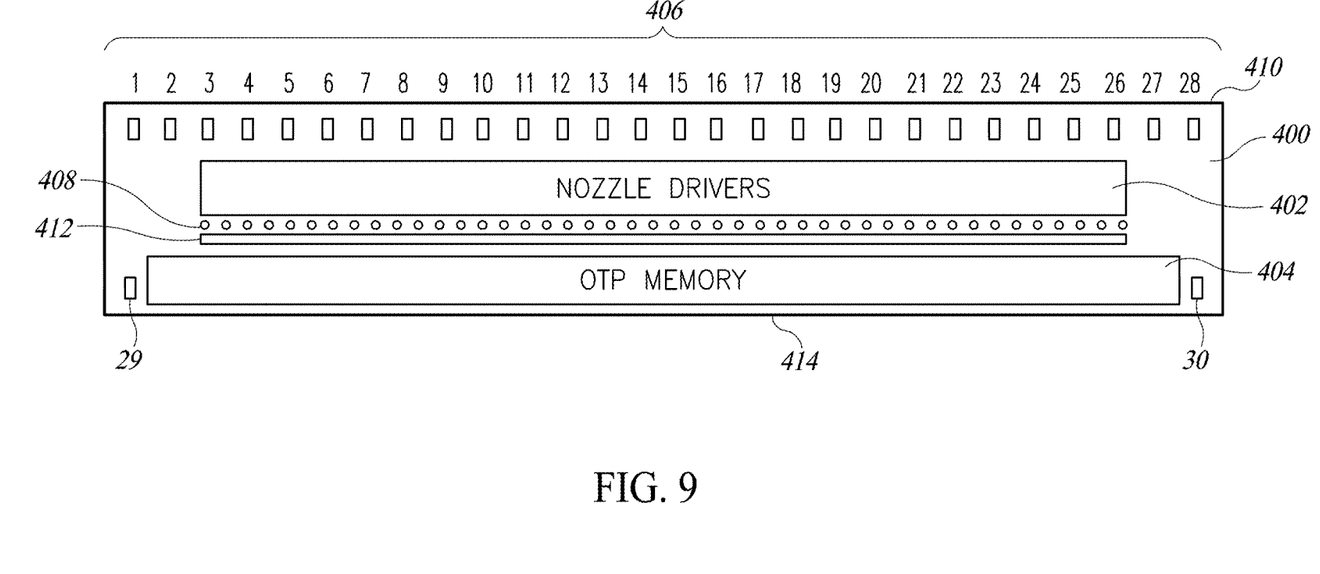

FIGS. 8 and 9 are alternative embodiments of a microfluidic die 400 that includes nozzle driver circuits 402, one time programmable memory 404, and a relatively small number of contact pads 406 as compared to a number of nozzles 408. In FIG. 9, the contact pads 406 are aligned along a first side 410 of the die. The die includes a fluid inlet path 412 through which fluid flows from a reservoir into the die and, ultimately, out of the nozzles 408. The nozzles are positioned between the inlet path 412 and the contact pads 406. The nozzle driver circuits 402 are positioned between the contacts and the nozzles. The memory 404 is positioned between the inlet path and a second side 414 of the die.

The illustrated embodiment includes 120 nozzles 408 and 30 contact pads. Contact pads 1-28 are on the first side of the die and contact pads 29 and 30 are adjacent to and along the second side 414 of the die. Contact pad 29 is on one side of the memory and contact pad 30 is on the other side of the memory. Contact pads 29 and 30 may be mechanical support contact pads that may be electrically coupled to other devices. In one example, the dimensions of this die are 12.3 millimeters by 2.3 millimeters.

FIG. 8 includes circuitry 420 that includes a decoding block 422 that receives inputs from a discharge contact pad and from a plurality of first selection contact pads C1-C10. This die is configured to have 120 nozzles driven separately and includes 120 bits of one time programmable memory. The ten contact pads C1-C10 are provided to give a sufficient number of combinations to drive, read, and write the associated nozzles and memory. This example includes a die with 120 jets or nozzles at a spacing of 300 dots per inch.

In the example with 120 jets, there is a single firing transistor for each jet. A nozzle driver block 424 receives decoded signals from the decoding block 422 and receives a fire signal from one of the contact pads. If G1 (a contact pad) is selected, the nozzle driver block 424 is activated. A combination of 10 first selection pins (C1-C10) (command pins) and three second selection pins (G1-G3) (function pins) can be used to implement this simplified 120-jet die. The pin G1 is used to select and bias the firing transistors. The pin G2 is used to select and write to the memory and the pin G3 is used to select and read the memory.

A memory driver block 426 receives the decoded signals from the decoding block 422. It is envisioned that the same combination of input signals will both control ejection of fluid out of a nozzle and read and write the memory cell associated with that nozzle. The memory block receives a read signal from G3 and a write signal from G2.

The nozzle drivers each include three transistors coupled as pass-gate in series with a firing transistor, such as the examples described above. Gates of these three transistors are coupled to a 10-bit parallel interface, the decoding block 422, which permits 120 different combinations of input signals when using three signals per nozzle and memory cell.

A device is summarized as including: a die that includes: a plurality of chambers; a plurality of nozzles; a plurality of heaters associated with the plurality of chambers; a plurality of driving circuits, each driving circuit coupled to at least two of the plurality of heaters; and a plurality of one time programmable memory bits, each memory bit associated with each driving circuit.

The device further comprises a plurality of contact pads that include a first plurality of selection contact pads and a second plurality of selection contact pads.

A ratio of a number of driving circuits to a number of first plurality of selection contact pads is in the range of 20:3 and 10:1. Each driving circuit includes: a first transistor coupled to the first plurality of selection contact pads; a second transistor coupled to the first plurality of selection contact pads; a third transistor coupled to the first plurality of selection contact pads; a fourth transistor coupled between the first transistor and ground; a fifth transistor coupled between the second transistor and ground; and a sixth transistor coupled between the third transistor and ground. A gate of the first transistor is coupled to the first plurality of selection contact pads, a first terminal of the first transistor is coupled to the second plurality of selection contact pads and a second terminal of the first transistor is coupled to a first terminal of the second transistor and a first terminal of the fourth transistor. A gate of the second transistor is coupled to the first plurality of selection contact pads, a second terminal of the second transistor is coupled to a first terminal of the third transistor and a first terminal of the fifth transistor. A gate of the third transistor is coupled to the first plurality of selection contact pads, a second terminal of the third transistor is coupled to a first terminal of the sixth transistor. The plurality of contact pads includes a discharge contact pad and gates of the fourth, fifth, and sixth transistors are coupled to the discharge contact pad.

The device further comprises a firing transistor, a gate of the firing transistor being coupled to the second terminal of the third transistor.

A first terminal of the firing transistor is coupled to ground and a second terminal is coupled to the at least two of the plurality of heaters.

The device further comprises a plurality of memory circuits configured to read and write the memory bits, each memory circuit includes a read branch and a write branch, each read branch and each write branch includes: a first transistor having a gate coupled to the first plurality of selection contact pads and a first terminal coupled to the second plurality of selection contact pads; a second transistor having a gate coupled to the first plurality of selection contact pads, a first terminal coupled to a second terminal of the first transistor; a third transistor having a gate coupled to the first plurality of selection contact pads, a first terminal coupled to a second terminal of the second transistor; a read or write control transistor having a gate coupled to a second terminal of the third transistor, a first terminal coupled to ground, and a second terminal coupled to the memory bit.

The plurality of contact pads includes a discharge contact pad, and each read branch and each write branch includes: a fourth transistor having a gate coupled to the discharge contact pad, a first terminal coupled to the second terminal of the first transistor, and a second terminal coupled to ground; a fifth transistor having a gate coupled to the discharge contact pad, a first terminal coupled to the second terminal of the second transistor, and a second terminal coupled to ground; and a sixth transistor having a gate coupled to the discharge contact pad, a first terminal coupled to the second terminal of the third transistor, and a second terminal coupled to ground.

Each reach branch is coupled to a first one of the second plurality of selection contact pads and each write branch is coupled to a second one of the second plurality of selection contact pads.

A device includes: a substrate; a plurality of chambers on the substrate; a plurality of nozzles corresponding to the plurality of chambers; a plurality of fluid ejection elements in the substrate corresponding to the plurality of chambers; a plurality of fluid ejection circuits; a plurality of memory bits; a plurality of contact pads configured to be receive signals from an external source, the plurality of contact pads including: a plurality of first selection contacts configured to select at least one of the plurality of chambers and at least one of the plurality of memory bits; and a plurality of second selection contacts configured to select between a fluid ejection mode, a read mode, and a write mode.

A ratio of the plurality of first selection contacts to the plurality of second selection contacts in the range of 2:1 and 3:2. A number of the plurality of chambers is equal to a number of the plurality of fluid ejection circuits. A number of the plurality of chambers is two times a number of the plurality of fluid ejection circuits, such that pairs of the chambers are driven by one of the plurality of fluid ejection circuits.

A device may be summarized as including: a plurality of chambers, each chamber being associated with at least one nozzle; a plurality of fluid ejection elements associated with the plurality of chambers; a plurality of driving circuits coupled to the plurality of fluid ejection elements; a plurality of one time programmable memory bits; a plurality of contact pads that are configured to control both the plurality of driving circuits and the plurality of one time programmable memory bits; and decoding circuitry coupled to the plurality of driving circuits, the plurality of one time programmable memory bits, and the plurality of contact pads.

A number of the plurality of fluid ejection elements is greater than a number of the plurality of driving circuits and a number of the plurality of contacts pads is smaller than the number of the plurality of driving circuits. A ratio of the number of the plurality of driving circuits to the number of the plurality of contact pads is in the range of 5:2 and 8:3.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a microfluidic die that includes:
a semiconductor substrate;
a plurality of contact pads in the semiconductor substrate;
a first plurality of chambers in the semiconductor substrate;
a first plurality of nozzles;
a first plurality of heaters in the semiconductor substrate;
a first plurality of driving circuits configured to provide driving signals to the first plurality of heaters, the first plurality of driving circuits positioned between the first plurality of nozzles and the plurality of contact pads, each driving circuit of the first plurality of driving circuits including at least a transistor in the semiconductor substrate and coupled to one of the plurality of contact pads; and
a first memory in the semiconductor substrate including a first plurality of one time programmable memory bits, each respective one time programmable memory bit of the first plurality of one time programmable memory bits being associated with a respective one of the driving circuits of the first plurality of driving circuits.

2. The device of claim 1 wherein each of the first plurality of driving circuits is electrically coupled to at least two of the first plurality of heaters, and is configured to provide a driving signal to the at least two of the first plurality of heaters.

3. The device of claim 1 wherein the die includes a second memory including a second plurality of programmable memory bits, each of the second plurality of programmable memory bits being associated with a respective driving circuit of a second plurality of driving circuits.

4. The device of claim 3 wherein the first memory is at a first end of the semiconductor substrate and the second memory is at a second end of the semiconductor substrate that is opposite to the first end, the first plurality of nozzles, the first plurality of driving circuits, and the second plurality of driving circuits are positioned between the first memory and the second memory.

5. The device of claim 1 wherein the plurality of contact pads includes a first plurality of selection contact pads configured to select at least one of the first plurality of chambers and at least one of the first plurality of programmable memory bits, and a second plurality of selection contact pads configured to select between a fluid ejection mode, a read mode, and a write mode.

6. The device of claim 1 wherein the die includes:
a second plurality of chambers;
a second plurality of nozzles;
a second plurality of heaters configured to heat the second plurality of chambers;
a second plurality of driving circuits configured to provide driving signals to the second plurality of heaters; and
an inlet path coupled to the first and second plurality of chambers, the inlet path positioned between the first plurality of nozzles and the second plurality of nozzles.

7. The device of claim 1 wherein the first plurality of nozzles are positioned between the first plurality of driving circuits and the first memory.

8. A device, comprising:
a microfluidic die including:
a semiconductor substrate;
a plurality of chambers on the semiconductor substrate;

a plurality of nozzles on the semiconductor substrate, the plurality of nozzles corresponding to the plurality of chambers;

a plurality of fluid ejection elements on the semiconductor substrate, the plurality of ejection elements corresponding to the plurality of chambers;

a memory on the semiconductor substrate, the memory including a plurality of memory bits;

a plurality of contact pads on the semiconductor substrate, the plurality of contact pads including:
- a plurality of first selection contacts configured to select at least one of the plurality of chambers and at least one of the plurality of memory bits; and
- a plurality of second selection contacts configured to select between a mode of the device, the plurality of first selection contacts and the plurality of second selection contacts being aligned with each other.

9. The device of claim 8 wherein the plurality of second selection contacts are configured to select between a fluid ejection mode, a read mode, and a write mode.

10. The device of claim 8, further comprising:
fluid ejection circuits on the semiconductor substrate and coupled to the plurality of fluid ejection elements, a number of the plurality of chambers being equal to a number of the plurality of fluid ejection circuits.

11. The device of claim 8, further comprising:
fluid ejection circuits on the semiconductor substrate and coupled to the plurality of fluid ejection elements, a number of the plurality of chambers is two times a number of the plurality of fluid ejection circuits, such that pairs of the chambers are driven by one of the plurality of fluid ejection circuits.

12. The device of claim 8, further comprising:
fluid ejection circuits on the semiconductor substrate and coupled to the plurality of fluid ejection elements, the plurality of fluid ejection elements positioned between the plurality of nozzles and the plurality of contact pads.

13. The device of claim 8 wherein the plurality of memory bits are one time programmable memory bits.

* * * * *